United States Patent [19]
Saiki et al.

[11] Patent Number: 6,084,244
[45] Date of Patent: *Jul. 4, 2000

[54] SCANNING EXPOSURE APPARATUS THAT COMPENSATES FOR POSITIONAL DEVIATION CAUSED BY SUBSTRATE INCLINATION

[75] Inventors: Kazuaki Saiki, Setagaya-ku; Tomohide Hamada, Yokohama, both of Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/126,639

[22] Filed: Jul. 30, 1998

Related U.S. Application Data

[63] Continuation of application No. 08/747,879, Nov. 13, 1996, abandoned, which is a continuation of application No. 08/471,811, Jun. 6, 1995, abandoned.

[30] Foreign Application Priority Data

Jun. 13, 1994 [JP] Japan .................................. 6-154117

[51] Int. Cl.$^7$ .................................................. G01N 21/86
[52] U.S. Cl. ........................ 250/548; 250/559.3; 356/400
[58] Field of Search ................................ 250/548, 208.1, 250/559.3; 356/399–402, 375; 355/53

[56] References Cited

U.S. PATENT DOCUMENTS 5,654,553  8/1997  Kawakubo et al. ...................... 250/548
5,777,722  7/1998  Miyazaki et al. .......................... 355/53

*Primary Examiner*—Que T. Le
*Attorney, Agent, or Firm*—Oliff & Berridge, PLC

[57] ABSTRACT

A scanning exposure apparatus of the present invention is constructed in such an arrangement that while a mask and a substrate are moved relatively to a projection optical system, a pattern formed on the mask is projected for exposure through the projection optical system onto the substrate. The scanning exposure apparatus is provided with a leveling control portion for successively controlling an amount of relative inclination between the substrate and the mask with movement thereof, based on a predetermined leveling angle command θ, so that an exposure area of the substrate becomes approximately coincident with an image plane of the pattern of the mask, a positional deviation measuring and control portion for measuring and controlling an amount of relative positional deviation between the mask and the substrate, and a positional deviation calculating and correcting portion for calculating an amount of relative positional deviation between the mask and the substrate, which will be caused by the control of the leveling control portion, based on the leveling angle command, and effecting correction of the relative positional deviation on the positional deviation measuring and control portion.

29 Claims, 6 Drawing Sheets

SCANNING EXPOSURE APPARATUS THAT COMPENSATES FOR POSITIONAL DEVIATION CAUSED BY SUBSTRATE INCLINATION

This is a continuation of application Ser. No. 08/747,879, filed Nov. 13, 1996, abandoned, which is a continuation application of prior application Ser. No. 08/471,811, abandoned, filed on Jun. 6, 1995.

BACKGROUND OF THE INVENTION

1. Field of the Invention

The present invention relates to a scanning exposure apparatus, and more particularly to a scanning exposure apparatus suitably applied in fabricating large-scale liquid crystal display devices etc.

2. Related Background Art

The large-scale liquid crystal display devices etc. are fabricated using scanning exposure apparatus requiring no large-scale projection optical system. This type of scanning exposure apparatus perform projection exposure while scanning a mask and a photosensitive substrate in a same direction.

Generally, surfaces of the mask and substrate are not perfectly flat because of bowing etc. Thus, scanning is performed with so-called leveling adjustment so as not to cause image defocus during exposure in each exposure area.

SUMMARY OF THE INVENTION

A scanning exposure apparatus of the present invention is arranged to project for exposure a pattern formed on a mask onto a substrate through a projection optical system while moving the mask and the substrate relative to the projection optical system, which comprises leveling control means for successively controlling a relative inclination amount between the substrate and the mask with movement thereof, based on a predetermined leveling angle command 6, so that an exposure area of the substrate becomes approximately coincident with an image plane of the pattern of the mask, formed through the projection optical system, positional deviation measuring and controlling means for measuring and controlling a relative positional deviation amount between the mask and the substrate, and positional deviation calculating and correcting means for calculating, based on the leveling angle command, a relative positional deviation between the mask and the substrate, which will be caused by a control by the leveling controlling means, and effecting correction thereof on the positional deviation measuring and controlling means.

In a preferred aspect of the present invention, the calculating and correcting means calculates a velocity component for relatively moving the mask and the substrate, based on the leveling angle command, and corrects the positional deviation measuring and controlling means.

Also, the positional deviation measuring and controlling means measures an amount of relative positional deviation between the mask and the substrate and relatively moves the mask and the substrate so as to minimize the positional deviation amount.

The relative positional deviation between the mask and the substrate, caused by the leveling drive of a substrate stage, is a factor of positional disturbance against a position feedback loop. However, because the operation is based on the predetermined leveling angle command, a correction amount is predictable. Thus, the present invention involves successively obtaining, based on the leveling angle command, prediction amounts of relative positional deviation between the mask and the substrate, which will be caused by relative inclination between the mask and the substrate due to the leveling drive based on the leveling angle command, and using the prediction amounts for correction for position feedback. Then the position feedback loop relatively moves the mask and the substrate so as to minimize a relative positional deviation finally remaining between the mask and the substrate.

Namely, the present invention employs the calculating means for obtaining a relative positional deviation component which will be caused by the leveling drive based on the leveling angle command. Then the relative positional deviation amount obtained or a velocity component thereof is supplied as a feedforward signal to the positional deviation measuring and controlling means. After correction based on the feedforward signal, the positional deviation measuring and controlling means performs a feedback control to minimize a positional deviation finally remaining.

In this manner, the scanning exposure apparatus of the present invention can minimize the relative positional deviation caused by the leveling drive among relative positional deviations without damaging the stability of a feedback system, i.e., without expanding a response band.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
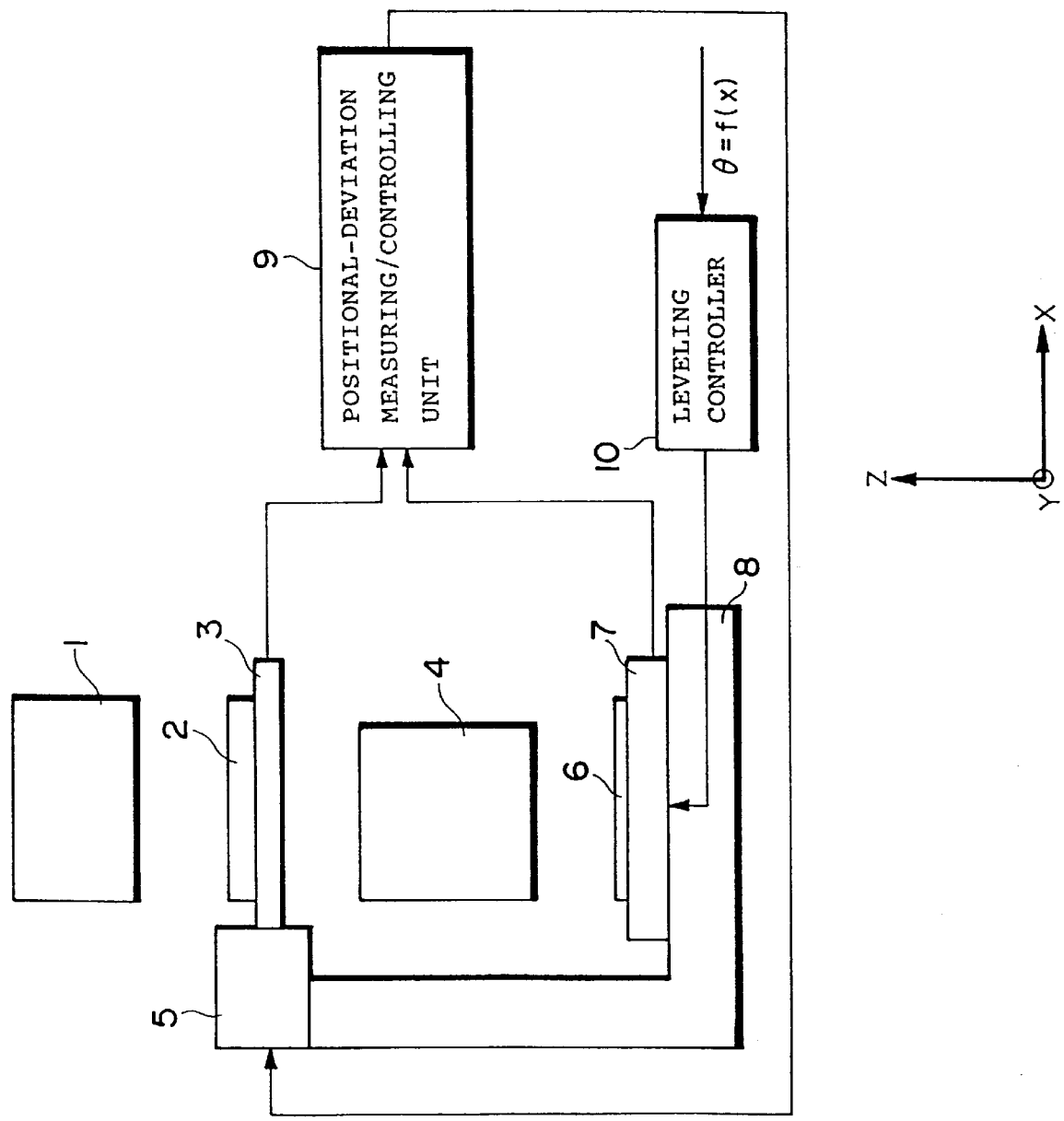
FIG. 1 is a drawing to schematically show the structure of a scanning exposure apparatus provided with a feedback control system.

FIG. 1 is a drawing to schematically show the structure of a scanning exposure apparatus provided with a feedback control system. In FIG. 1, an illumination optical system 1 uniformly illuminates patterns formed on a mask 2 mounted on a mask stage 3, and the patterns are projected through a projection optical system 4 to a photosensitive substrate 6 mounted on a substrate stage 7 to effect exposure thereon. The mask stage 3 and substrate stage 7 are unitedly supported by a carriage 8 and scanned in the X direction in the drawing upon projection exposure.

Generally, surfaces of mask 2 and substrate 6 are not perfectly flat because of influence of bowing etc. Therefore, in order to suppress occurrence of image defocus in each exposure area of substrate 6 during scanning exposure, in other words, so as to keep each exposure area approximately coincident with an image plane of the patterns of mask 2, formed through the projection optical system 4, the exposure scanning needs to be performed while effecting fine tilting adjustment of the substrate stage 7 wholly about the X axis and about the Y axis (hereinafter referred to as "leveling drive" or "leveling adjustment").

Specifically, a leveling control unit 10 leveling-drives the substrate stage 7, based on a leveling angle command corresponding to configurations of the surfaces of mask 2 and substrate 6.

The leveling adjustment during scanning exposure will generate the relative positional deviation in the x direction and the Y direction between the mask 2 and the substrate 6. Also, the relative positional deviation is caused in the X direction and the Y direction by other disturbance factors (for example, pitching and rolling motions of the carriage). Thus, a positional deviation measuring and controlling portion 9 measures the relative positional deviation between the mask stage 3 and the substrate stage 7, that is, the relative positional deviation between the mask 2 and the substrate 6. Based on the information on the relative positional deviation thus measured, the positional deviation measuring and controlling portion 9 finely adjusts the mask stage 3, in turn the mask 2, through a mask stage drive mechanism 5 within the XY plane so as to minimize the relative positional deviation between the mask 2 and the substrate 6. In this manner, a position feedback loop is constructed to measure the relative positional deviation between mask 2 and substrate 6, actually generated by the leveling drive and other disturbance factors, and to control the position of the mask stage 3 so as to minimize an amount of the relative positional deviation measured.

In such scanning exposure apparatus, the position feedback loop, however, includes resonance of the mechanical system such as the stage drive mechanism 5 etc., and thus, the response band of the position feedback loop cannot be widely secured. Thus, if the frequency of the relative positional deviation due to the leveling drive or other disturbance factors should be over the response band, an amount of relative positional deviation over requirements accuracy would remain because of response delay.

Figure 2:
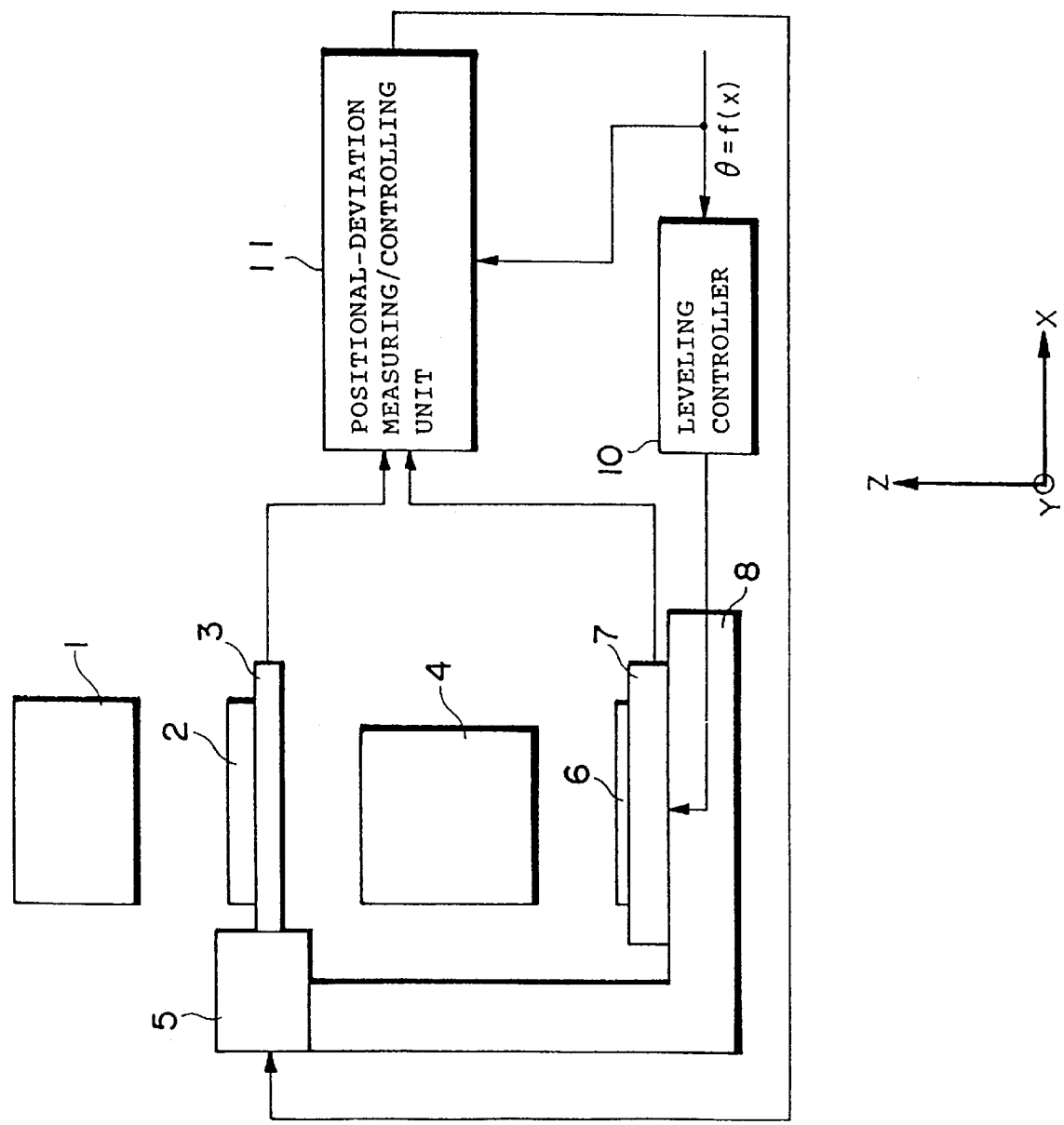
FIG. 2 is a drawing to schematically show the structure of a scanning exposure apparatus provided with a control system having a feedforward loop.

FIG. 2 is a drawing to show the structure of a scanning exposure apparatus provided with a control system having a feedforward loop. In FIG. 2, the X axis is taken along a direction of scanning of the mask 2 with predetermined patterns formed thereon and the substrate 6, the Y axis along a direction perpendicular to the X axis within a plane parallel to the mask 2, and the Z axis along a direction of a normal line to the mask 2.

The scanning exposure apparatus of FIG. 2 is provided with an illumination optical system 1 for uniformly illuminating the mask 2. The mask 2 is mounted on the mask stage 3 so as to be approximately parallel to the XY plane. The projection optical system 4 is disposed below the mask 2 in the drawing, and further below the projection optical system 4 in the drawing the substrate 6 is mounted on the substrate stage 7 so as to be approximately parallel to the XY plane. Accordingly, the optical axis of the projection optical system 4 is parallel to the Z axis.

Figure 3:
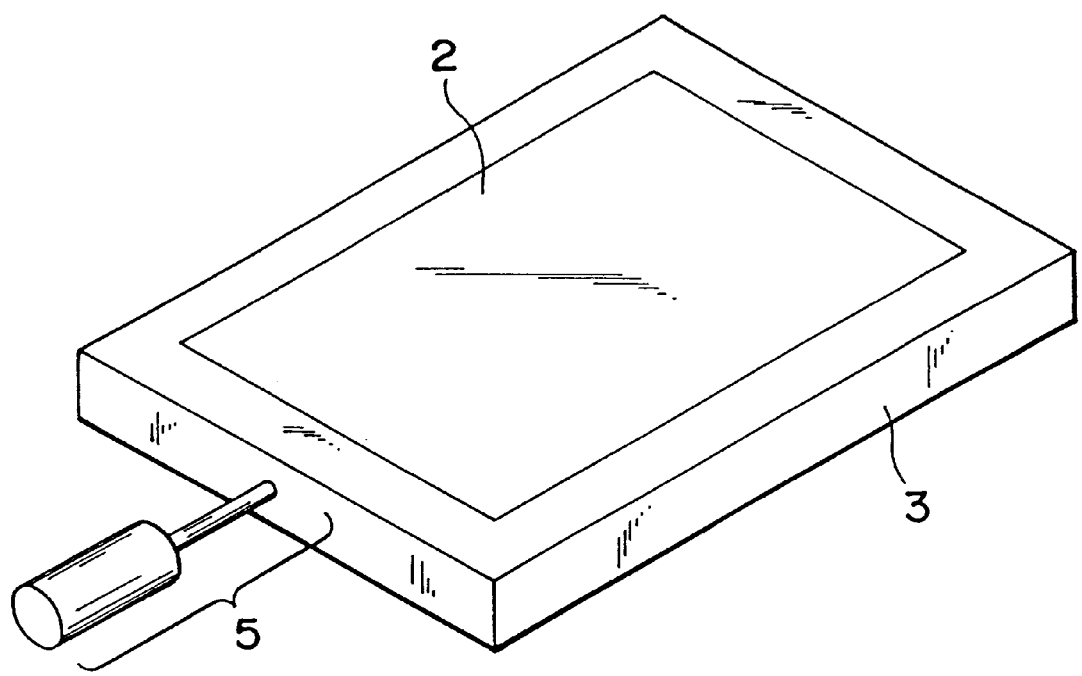
FIG. 3 is a perspective view to show the structure of a mask stage and a drive mechanism thereof shown in FIG. 2.

The mask stage 3 and substrate stage 7 are unitedly supported by a common carriage 8. Then the mask stage 3 is movable in the X direction and the Y direction by means of the mask stage driving mechanism 5. An X-directional drive mechanism in the mask stage drive mechanism 5, as shown in FIG. 3, is composed, for example, of a rotation motor with tacho-generator, and a mechanism for converting a rotational motion of an output shaft of the motor into a rectilinear motion (which is for example composed of a feed screw, a nut, and a lever). A Y-directional drive mechanism in the mask stage drive mechanism 5 also has a like structure.

The scanning exposure apparatus of FIG. 2 is also provided with a positional deviation measuring and controlling portion 11 (as detailed later) for measuring a relative positional deviation between the mask 2 and the substrate 6. The measurement of the relative positional deviation between the mask 2 and the substrate 6 is carried out, for example using laser interferometers for emitting laser beams toward corresponding reflective mirrors each mounted on the mask stage 3 and the substrate stage 7 and receiving interferometric light of laser beams reflected by the respective reflective mirrors.

The scanning exposure apparatus of FIG. 2 is further provided with a leveling control portion 10 for controlling the leveling drive of the substrate stage 7, based on a leveling angle command (leveling drive command) corresponding to configurations of the surfaces of mask 2 and substrate 6 preliminarily measured. The leveling control portion 10 is composed, for example, of a microcomputer and peripheral circuits thereof. Incidentally, the substrate stage 7 is arranged to be finely adjusted also in the Z direction during scanning exposure by a suitable means not shown.

Figure 4:
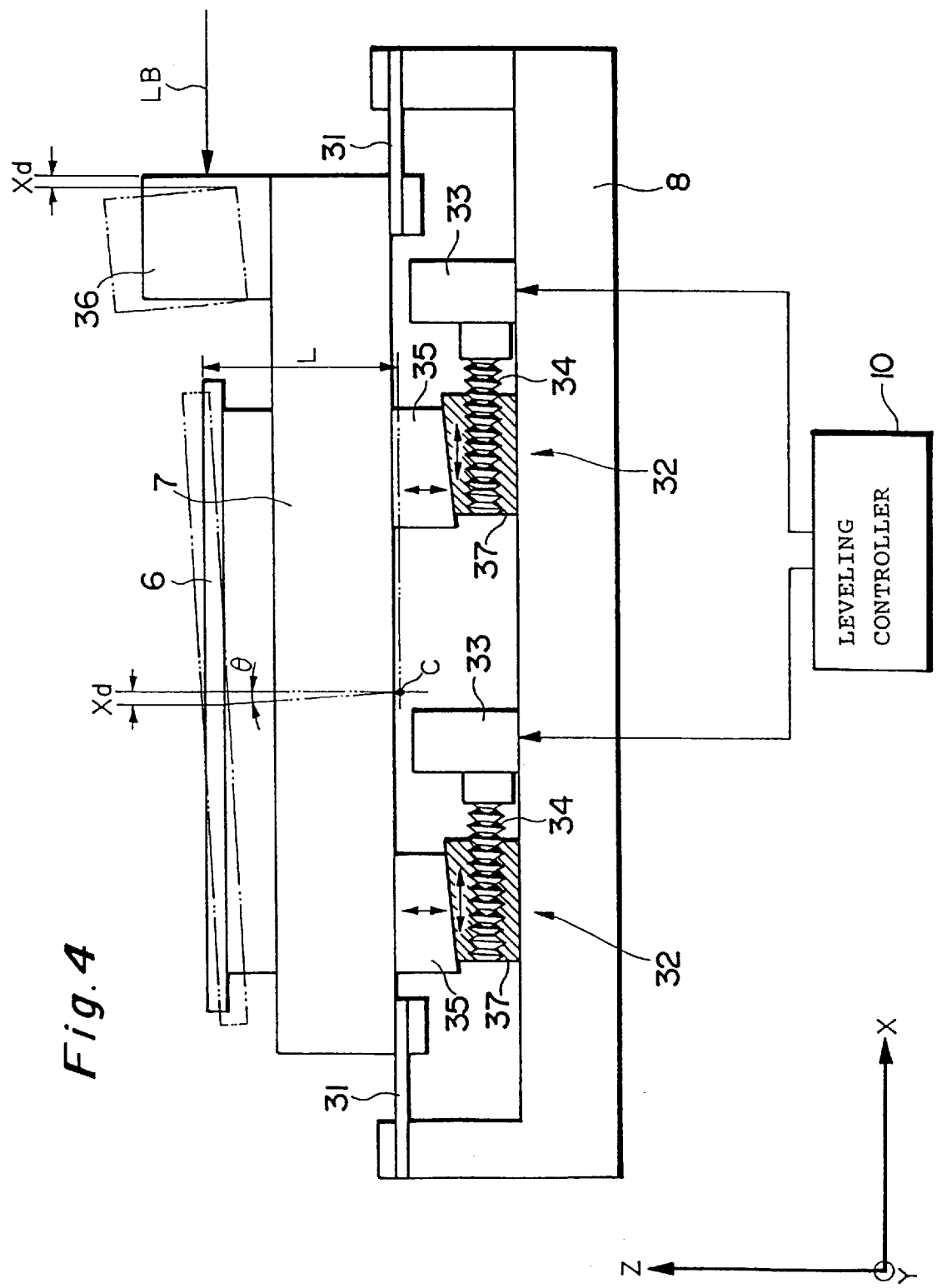
FIG. 4 is a drawing to show the structure of a leveling mechanism for a substrate stage shown in FIG. 2.

FIG. 4 is a drawing to show the structure of the leveling mechanism for the substrate stage 7 in FIG. 2. In FIG. 4, the substrate stage 7 on which the substrate 6 is mounted is supported in parallel with the XY plane by the carriage 8 through plate springs 31. Some points on the substrate stage 7 are arranged as finely movable in the Z direction by rotation-translation converting mechanisms 32. Further, on the substrate stage 7 there is provided a reflective mirror 36 for reflecting a laser beam for interferometric measurement LB from the positional deviation measuring and controlling portion 11.

Each rotation-translation converting mechanism 32 has a threaded shaft 34 extending in the X direction and attached to an output shaft of a motor 33 with encoder, and a female screw portion 37 meshed with the shaft 34. The bottom face of the female screw portion 37 is slidable in the X direction on the carriage 8 and the top face thereof is a slant surface relative to the X axis. The slant top face of the female screw portion 37 is in contact with a slant bottom face of a leg 35 of the substrate stage 7.

In such a structure, when the encoder-added motor 33 is driven, the shaft 34 rotates, so that the female screw portion 37 moves in the ±X direction according to the direction of rotation thereof. As a consequence, the leg 35 of the substrate stage 7 supported in contact by the slant top face of the female screw portion 37 translationally move up and down (in the Z direction) in the drawing.

It is noted that FIG. 4 shows only two motors 33 having output shafts extending in the X direction and two rotation-translation converting mechanisms 32 corresponding thereto. The leveling mechanism for the substrate stage 7 is, however, composed of at least three motors 33 having output shafts extending in the X direction and three rotation-translation converting mechanisms 32 corresponding thereto, and at least three motors (not shown) having output shafts extending in the Y direction and three rotation-translation converting mechanisms (not shown) corresponding thereto.

The motors 33 each are controlled independently of each other by the leveling control portion 10. As a consequence, the substrate stage 7 can wholly be adjusted so as to be properly finely tilted about the X axis and about the Y axis.

In this arrangement, as shown in FIG. 4, when the motors 33 having the output shafts extending in the X direction are property driven, the substrate stage 7, in turn the substrate 6, can be tilted by angle θ around the Y axis with the leveling rotation center C as a center. As a result, individual points on the top face of the substrate 6 spaced by an amount L in the Z direction from the leveling rotation center C show a positional deviation of $x_d = L \cdot \sin\theta$ in the X direction. In FIG. 4, the chain double-dashed lines represent positions of the substrate 6 and the reflective mirror 36 tilted by the leveling drive of the substrate stage 7.

Since the interferometric measurement laser beam LB is arranged to be incident at the same height as the top face of the substrate 6, a point of reflection of the interferometric measurement laser beam LB on the reflective mirror 36 exhibits a positional deviation of $x_d$ in the X direction. In this manner the laser interferometer of the positional deviation measuring and controlling portion 11 can measure the positional deviation amount $x_d$ of the substrate 6 in the X direction, as caused by the leveling adjustment.

Figure 5:
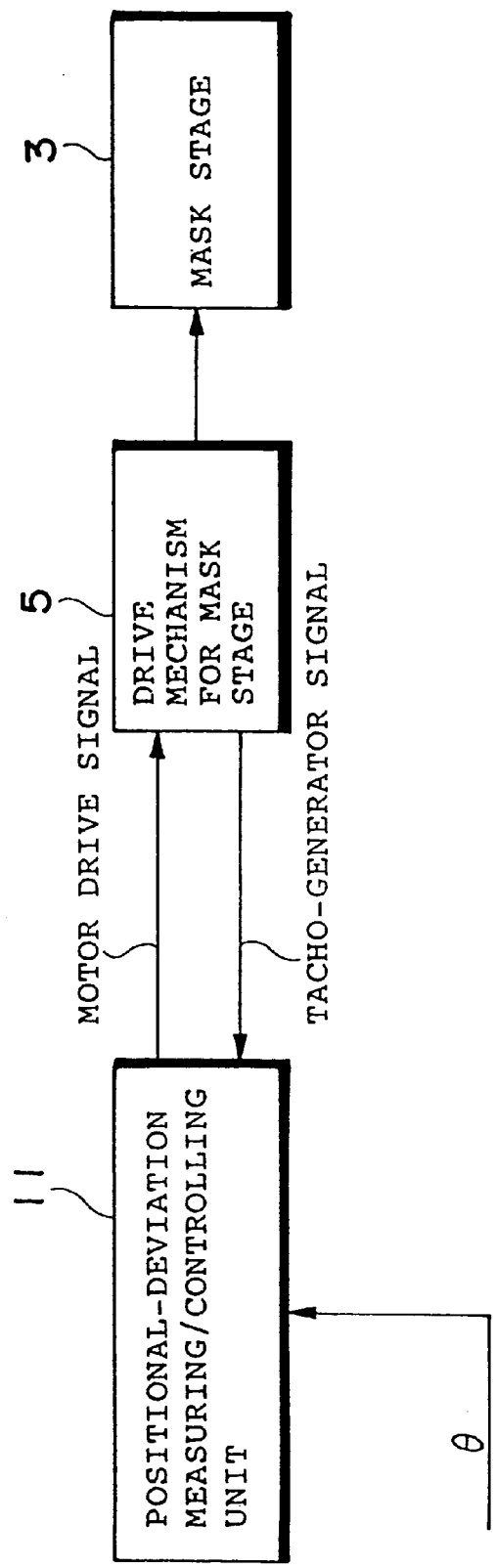
FIG. 5 is a drawing to show the structure of the control system of the scanning exposure apparatus shown in FIG. 2.
Figure 6:
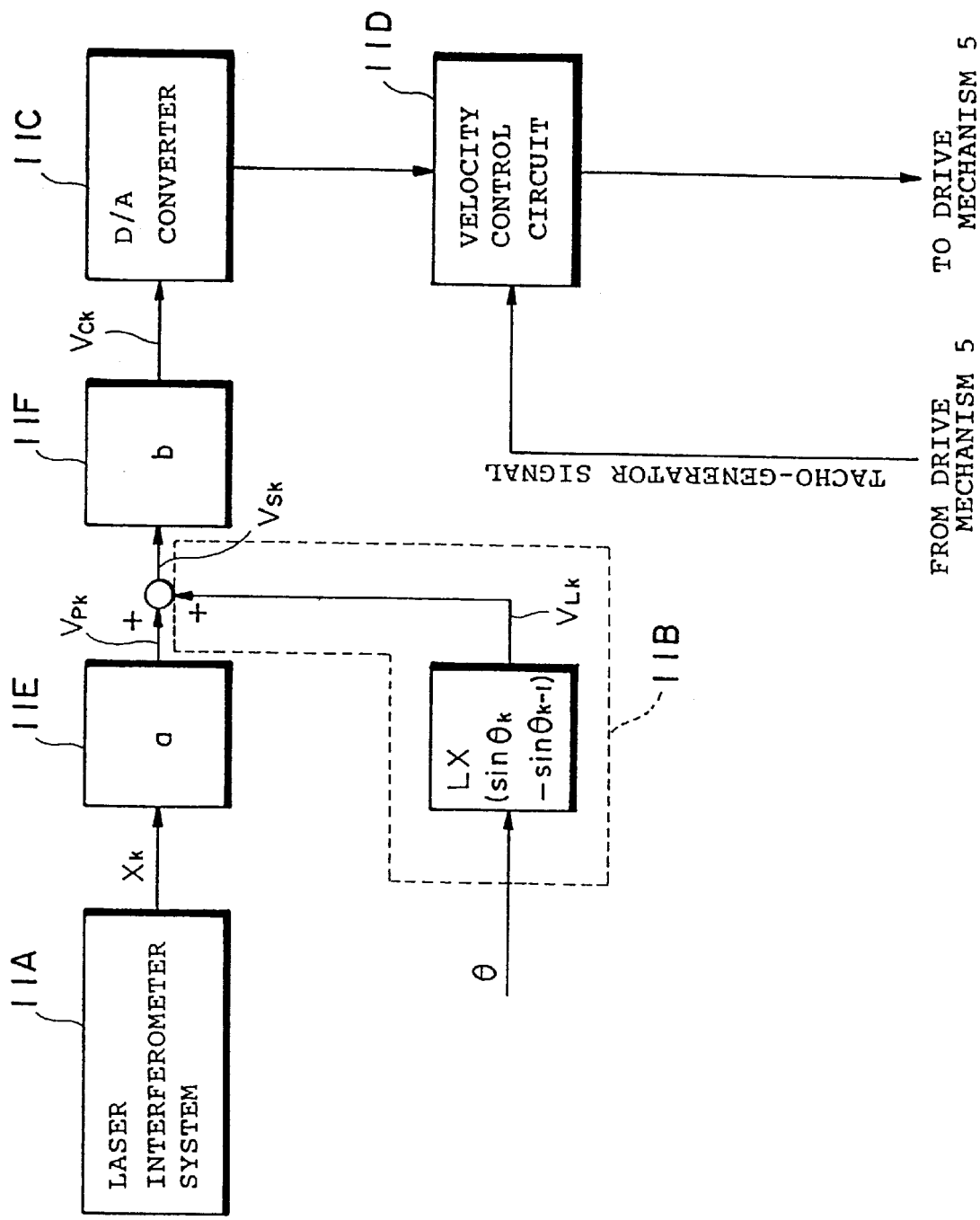
FIG. 6 is a drawing to show the internal structure of a positional deviation measuring and controlling portion shown in FIG. 2.

FIG. 5 is a drawing to show the structure of the control system in the exposure apparatus of FIG. 2, and FIG. 6 is a drawing to show the internal structure of the positional deviation measuring and controlling portion. Next described referring to FIG. 5 is the correction operation of relative positional deviation in the scanning exposure apparatus of the present embodiment.

As described above, the leveling drive is performed about the X axis and about the Y axis independently of each other. Thus, the present specification describes the operation, focusing only on the leveling drive about the Y axis, that is, the case shown in FIG. 4, for simplicity.

During scanning exposure a host computer outputs to the positional deviation measuring and controlling portion 11 and the leveling control portion 10 the leveling angle command θ=f(x) given as a function of a coordinate x in the X direction (scanning direction), of the exposure area. The leveling control portion 10 leveling-drives the substrate stage 7, based on the leveling angle command θ, so that the exposure area of substrate 6 becomes approximately coincident with the image plane of patterns of mask 2, formed through the projection optical system 4.

As described previously, the leveling drive of the substrate stage 7 based on the leveling angle command θ generates the relative positional deviation of $x_d = L \cdot \sin\theta$ in the X direction between the substrate 6 and the mask 2.

On the other hand, the microcomputer and peripheral circuits thereof in the positional deviation measuring and controlling portion 11 receiving the leveling angle command θ perform the following calculations as receiving the relative positional deviation amount $x_d$ measured by a laser interferometer system 11A (FIG. 6), and the leveling angle command θ at constant sampling intervals Δt (for example, 1 msec). In the following equations, subscripts k and k−1 indicate the k-th sampling and the (k−1)th sampling, respectively.

$$v_{Pk} = a \times x_k \quad (1)$$

$$v_{Lk} = L \times (\sin\theta_k - \sin\theta_{k-1}) \quad (2)$$

$$v_{Sk} = v_{Pk} + v_{Lk} \quad (3)$$

$$v_{Ck} = b \times v_{Sk} \quad (4)$$

In the above equations, a: a constant or variable for converting a relative positional deviation amount into a velocity component thereof;

b: a constant of translation-rotation conversion of the mask stage drive mechanism 5;

$v_{Pk}$: a velocity component calculated from a relative positional deviation amount measured;

$v_{Lk}$: a velocity component of a relative positional deviation caused by leveling;

$v_{Sk}$: a velocity component after correction of a relative positional deviation caused by leveling;

$v_{Ck}$: a motor rotational velocity component of the mask stage drive mechanism 5.

Equation (1) obtains the velocity command $v_{Pk}$ for the mask stage 3 to be driven in the X direction in order to correct a relative positional deviation amount $x_k$ between the mask 2 and the substrate 6, sampled at the k-th sampling (or actually measured) (not taking account of the relative positional deviation amount that will be generated by the leveling drive based on the k-th leveling angle command $\theta_k$) The operation of Equation (1) is carried out by a multiplier 11E (FIG. 6).

Equation (2) obtains the velocity command $v_{Lk}$ for correction of the relative positional deviation amount between the mask 2 and the substrate 6 generated due to only the k-th leveling drive, based on the (k−1)th leveling angle command $\theta_{k-1}$ and the k-th leveling angle command $\theta_k$. The calculation of Equation (2) is carried out by the positional deviation calculating portion 11B (FIG. 6).

Equation (3) obtains the velocity command $v_{Sk}$ for correction of the relative positional deviation amount actually measured and the relative positional deviation amount which will be caused by the leveling drive based on the k-th leveling angle command $\theta_k$, by addition of the velocity command $v_{Pk}$ and the velocity command $v_{Lk}$. Namely, the final velocity command $v_{Sk}$ is obtained by adding $v_{Pk}$ by feedback to $v_{Lk}$ by feedforward.

Equation (4) converts the velocity command $v_{Sk}$ obtained by Equation (3) into the motor rotational velocity command $v_{Ck}$ of the drive mechanism 5, based on the constant of translation-rotation conversion of the mask stage drive mechanism 5. The calculation of Equation (4) is performed by a multiplier 11F (FIG. 6).

The motor rotational velocity command $v_{Ck}$ thus calculated by the microcomputer and peripheral circuits thereof in the positional deviation measuring and controlling portion 11 is output to a D/A converter 11C (FIG. 6). The D/A converter 11C converts the motor rotational velocity command $v_{Ck}$ into an analog signal and outputs the analog signal to a velocity control circuit 11D (FIG. 6). The velocity control circuit 11D receives the analog signal from the D/A converter 11C to output a motor drive signal to the mask stage drive mechanism 5. The drive mechanism 5 properly moves the mask stage 3, in turn the mask 2, in the X direction, based on the motor drive signal, to correct the relative positional deviation amount $x_d$ to the substrate 6.

Since the scanning exposure apparatus of the present embodiment is arranged to correct the deviation using the feedforward loop with prediction of the relative positional deviation amount between the mask 2 and the substrate 6 generated by leveling as described above, the leveling angle command θ is also input into the positional deviation measuring and controlling portion 11. Then the relative positional deviation amount caused by the leveling drive is calculated based on the leveling angle command θ input and the thus calculated value is applied as a correction signal, thereby effecting such a control to minimize the relative positional deviation amount between the mask 2 and the substrate 6.

The above-described embodiment showed an example in which the mask 2 and substrate 6 are relatively moved to each other by driving the mask 2 in the XY plane, but it is apparent that both the mask 2 and substrate 6 or only the substrate 6 may be driven in the XY plane.

Also, the above-described embodiment showed the laser interferometers as means for measuring the relative positional deviation between the mask 2 and the substrate 6, but it is a matter of course that the measuring means is not limited to the laser interferometers.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.154117/1994 filed on Jun. 13, 1994 is hereby incorporated by reference.

What is claimed is:

1. A scanning exposure apparatus for projecting a pattern on a mask through a projection optical system onto a sensitive substrate while relatively moving said mask and said substrate comprising:

a movable mask stage that holds said mask;

a movable substrate stage that holds said substrate;

a leveling unit connected to said movable substrate stage to control an amount of relative inclination of said substrate with respect to an imaging plane of said projection optical system;

a positional deviation measuring portion connected to said movable mask stage and to said movable substrate stage to measure a first amount of relative positional deviation between said mask and said substrate in a direction substantially perpendicular to an optical axis of said projection optical system during said relative movement between said mask and said substrate;

a positional deviation calculating portion having a microcomputer to calculate a second amount of a relative positional deviation between said mask and said substrate in said direction, said second amount of the relative deviation caused by said leveling unit controlling said relative inclination; and a compensating unit that drives at least one of said movable mask stage and said movable substrate stage during said relative movement between said mask and said substrate based on said measured first amount of positional deviation and said calculated second amount of positional deviation.

2. A scanning exposure apparatus according to claim 1, wherein said positional deviation measuring portion comprises laser interferometers that emit respective laser beams toward two reflective mirrors that are stationary relative to said mask and to said substrate.

3. A scanning exposure apparatus according to claim 1, wherein said positional deviation calculating portion calculates a position of at least one of said mask and said substrate in the direction perpendicular to the optical axis of said projection optical system.

4. A scanning exposure apparatus according to claim 1, wherein said positional deviation calculating portion calculates a relative velocity in the direction perpendicular to the optical axis of said projection optical system between said mask and said substrate.

5. A scanning exposure apparatus according to claim 1, wherein said positional deviation calculating portion calculates the second amount of relative positional deviation between said mask and said substrate in the direction perpendicular to the optical axis of said projection optical system as a value proportional to sin θ, where θ corresponds to said relative inclination.

6. A scanning exposure apparatus according to claim 1, further comprising a feed forward loop connected to said positional deviation calculating portion, wherein said second amount of relative positional deviation calculated by said positional deviation calculating portion is supplied to said compensating unit through said feed forward loop.

7. A scanning type projection method of projecting a pattern on a mask through a projection optical system onto a sensitive substrate during synchronous movement of said mask and said substrate, said method comprising the steps of:

measuring a first amount of relative positional deviation between said mask and said substrate in a direction substantially perpendicular to an optical axis of said projection optical system during said synchronous movement of said mask and said substrate;

calculating a second amount of relative positional deviation between said mask and said substrate in said direction, said second amount of the relative deviation being caused by inclining the substrate with respect to an imaging plane of said projection optical system; and driving at least one of said mask and said substrate to compensate for said first and second amounts of said positional deviation between said mask and said substrate in said direction based on said measuring step and said calculating step during said synchronous movement of said mask and said substrate.

8. A scanning projection method according to claim 7, wherein said compensating step is performed by controlling a moving speed of said mask.

9. A scanning projection method according to claim 7, wherein said second amount of said relative positional deviation is compensated for using a feedforward loop.

10. An image transfer apparatus which transfers a pattern of a mask onto a substrate while moving said substrate, said apparatus comprising:

a projection system located between said mask and said substrate to project said pattern onto said substrate;

a leveling unit having a first drive to control an amount of inclination of said substrate; and a compensating unit having a second drive to compensate for a positional shift of said substrate relative to said mask in a moving direction of said substrate during the movement of said substrate, said positional shift being caused when said leveling unit is driven.

11. An image transfer apparatus according to claim 10, wherein said compensating unit comprises a calculating unit for calculating said positional shift.

12. An image transfer apparatus according to claim 10, further comprising:

a movable mask stage that holds said mask;

a movable substrate stage that holds said substrate; and a moving unit connected to said movable mask stage and to said movable substrate stage to perform synchronous movement of said substrate and said mask.

13. An image transfer apparatus according to claim 12, further comprising:

a positional deviation detecting unit connected to said mask stage and to said substrate stage to detect an amount of relative positional deviation between said mask and said substrate in said moving direction.

14. An image transfer apparatus according to claim 13, further comprising a calculating unit that calculates a moving speed of at least one of said mask stage and said substrate stage.

15. An image transfer apparatus according to claim 14, wherein said moving speed is calculated based on said amount of positional deviation and said positional shift of said substrate.

16. A method of transferring a pattern onto a substrate, comprising the steps of:

moving said substrate while said pattern is being transferred to said substrate;

adjusting an inclination of said substrate during the transfer of said pattern onto said substrate during the movement of said substrate; and compensating for a positional shift of said substrate with respect to a moving direction of the substrate during the movement of said substrate, said positional shift being generated in said adjusting step.

17. A method according to claim 16, further comprising the step of:

premeasuring a shape of said substrate.

18. A method according to claim 16, wherein said compensating step is performed by adjusting a position of at least one of said substrate and a mask having said pattern.

19. A method according to claim 16, wherein said substrate and a mask having said pattern are synchronously moved during transfer of said pattern, and said compensating step comprises a step of detecting an amount of relative positional deviation between said mask and said substrate in a moving direction of said substrate.

20. A method according to claim 19, wherein said compensating step comprises the steps of:

calculating said amount of said relative positional deviation based on a predetermined leveling angle command; and controlling a position of said mask based on said amount calculated in said calculating step.

21. A substrate having a pattern exposed by the method according to claim 16.

22. A scanning exposure apparatus comprising:

a stage which synchronously moves a substrate and a mask having a pattern during transfer of said pattern onto said substrate;

a projection optical system located between said mask and said substrate to project said pattern onto said substrate;

a leveling unit connected to said stage, to adjust an amount of relative inclination of said substrate with respect to an imaging plane of said projection optical system; and a compensating unit connected to said stage to correct a positional shift between said mask and said substrate in a direction substantially perpendicular to an optical axis of said projection optical system, during synchronous movement of said mask and said substrate, said positional shift being generated when said leveling unit is driven.

23. A scanning exposure apparatus according to claim 22, wherein said stage comprises a mask stage for mounting said mask thereon to move said mask, and said compensating unit adjusts a position of said mask by movement of said mask stage.

24. A scanning exposure apparatus according to claim 23, wherein said compensating unit adjusts a position of said mask by controlling a speed of said mask stage.

25. A method for making an exposure apparatus which exposes a pattern of a mask onto an object while moving said object in a first direction, comprising the steps of:

providing an exposure device between said mask and said object to expose said pattern onto the object;

providing a movable object stage which holds said object thereon;

providing a leveling device connected to said movable object stage to control an amount of inclination of said object; and providing a compensating device, said compensating device having a drive to adjust a positional shift of said object in said first direction between said mask and said object during the movement of said stage, said positional shift being caused when said leveling device is driven.

26. A method according to claim 25, wherein said exposure device includes a mask, which has the pattern.

27. A method according to claim 26, wherein:

said drive comprises a mask stage; the mask stage being movable while holding said mask.

28. A method according to claim 26, wherein said exposure apparatus is a scanning type exposure apparatus which provides synchronized movement of said mask with said object to expose said pattern onto said object.

29. An object having a pattern transferred by the method according to claim 25.

* * * * *